(12) United States Patent
Vest (10) Patent No.: US 7,081,331 B2
(45) Date of Patent: Jul. 25, 2006

(54) METHOD FOR THERMALLY PROCESSING PHOTOSENSITIVE PRINTING SLEEVES

(76) Inventor: Ryan Vest, 3420 Canyon Oak Way, Cumming, GA (US) 30041

( * ) Notice: Subject to any disclaimer, the term of this patent is extended or adjusted under 35 U.S.C. 154(b) by 0 days.

(21) Appl. No.: 10/987,624

(22) Filed: Nov. 12, 2004

(65) Prior Publication Data
US 2006/0105268 A1    May 18, 2006

(51) Int. Cl.
G03F 7/09    (2006.01)
G03F 7/26    (2006.01)

(52) U.S. Cl. .................. 430/302; 430/271.1; 430/306; 430/309; 430/348; 430/434; 430/494; 101/132; 101/463.1

(58) Field of Classification Search ............ 430/270.1, 430/271.1, 302, 306, 309, 434, 494, 944, 430/945, 348; 101/453, 463.1, 132
See application file for complete search history.

(56) References Cited

U.S. PATENT DOCUMENTS

| | | | |
|---|---|---|---|
| 3,264,103 A | 8/1966 | Cohen et al. | |
| 4,045,231 A | 8/1977 | Toda et al. | |
| 4,323,636 A | 4/1982 | Chen | |
| 5,175,072 A | 12/1992 | Martens | |
| 5,223,375 A | 6/1993 | Berrier et al. | |
| 5,262,275 A | 11/1993 | Fan | |
| 5,279,697 A | 1/1994 | Peterson et al. | |
| 5,290,633 A | 3/1994 | Devlin et al. | |
| 5,760,880 A | 6/1998 | Fan et al. | |
| 5,798,019 A | 8/1998 | Cushner et al. | |
| 6,238,837 B1 | 5/2001 | Fan | |
| 6,413,699 B1 * | 7/2002 | Kanga | 430/302 |
| 6,425,327 B1 | 7/2002 | Fan et al. | |
| 6,531,184 B1 | 3/2003 | Bode et al. | |
| 6,605,410 B1 | 8/2003 | Yang et al. | |
| 6,640,711 B1 | 11/2003 | Smoot et al. | |
| 6,797,454 B1 | 9/2004 | Johnson et al. | |
| 6,966,259 B1 * | 11/2005 | Kanga et al. | 101/395 |
| 2001/0012599 A1 | 8/2001 | Michels et al. | |
| 2002/0018857 A1 | 2/2002 | Bode et al. | |
| 2002/0069777 A1 * | 6/2002 | Rossini et al. | 101/401.1 |
| 2003/0029378 A1 | 2/2003 | Bode et al. | |
| 2003/0131746 A1 | 7/2003 | Smoot et al. | |
| 2003/0180655 A1 | 9/2003 | Fan et al. | |
| 2003/0211423 A1 | 11/2003 | Mengel et al. | |
| 2005/0170287 A1 * | 8/2005 | Kanga | 430/300 |

FOREIGN PATENT DOCUMENTS

| | | |
|---|---|---|
| EP | 1 239 329 A2 | 9/2002 |
| WO | WO 01/18604 A2 | 3/2001 |
| WO | WO 01/88615 A1 | 11/2001 |

* cited by examiner

Primary Examiner—Barbara L. Gilliam
(74) Attorney, Agent, or Firm—Carmody & Torrance LLP (57) ABSTRACT

An improved method of manufacturing a photosensitive printing element that minimizes relief variation and improves image fidelity. The method involves a step of pre-curing the first (floor layer) of photocurable material prior to depositing an additional layer or layers of photocurable material that may be imaged and developed to produce a desired relief image on the surface of the photosensitive printing element. The photosensitive printing element is then thermally developed by contacting the photosensitive printing element with at least one roll that is capable of moving over at least a portion of the imaged surface of the flexographic printing element to remove the softened or melted non-crosslinked photopolymer. Non-crosslinked photopolymer on the imaged and exposed surface of the flexographic printing element can be softened or melted by positioning a heater adjacent to the imaged surface of the flexographic printing element and/or heating the at least one roll that contactable with the imaged surface of the flexographic printing element.

25 Claims, 4 Drawing Sheets

METHOD FOR THERMALLY PROCESSING PHOTOSENSITIVE PRINTING SLEEVES

FIELD OF THE INVENTION

The present invention is directed to an improved method of thermally processing photosensitive printing sleeves that minimizes relief variation and improves image fidelity.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset printing processes on print quality.

A typical flexographic printing plate as delivered by its manufacturer, is a multi-layered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

It is highly desirable in the flexographic prepress printing industry to eliminate the need for chemical processing of printing elements in developing relief images, in order to go from plate to press more quickly. Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. US 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use in the manufacture of flexographic plates for printing newspapers and other publications where quick turnaround times and high productivity are important.

The photopolymer layer allows for the creation of the desired image and provides a printing surface. The photopolymers used generally contain binders, monomers, photoinitiators, and other performance additives. The composition of the photopolymer should be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) will melt or substantially soften while the cured photopolymer will remain solid and intact at the temperature chosen. Thus the difference in melt temperature allows the uncured photopolymer to be selectively removed, thereby creating an image.

The printing element is then selectively exposed to actinic radiation. Preferably, the photopolymer layer is coated with an actinic radiation (substantially) opaque layer, which is also sensitive to laser ablation. A laser is then used to ablate selected areas of the actinic radiation opaque layer creating an in situ negative, and the printing element is then flood exposed through the in situ negative.

Once the photopolymer layer of the printing element has been selectively exposed to actinic radiation, it can then be developed using heat. As such, the printing element is generally heated to at least about 70° C. The exact temperature will depend upon the properties of the particular photopolymer being used. However, two primary factors should be considered in determining the development temperature:

1. The development temperature is preferably set between the melt temperature of the uncured photopolymer on the low end and the melt temperature of the cured photopolymer on the upper end. This will allow selective removal of the photopolymer, thereby creating the image.
2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Once the heated printing element has been developed, uncured photopolymer can be melted or removed. In most instances, the heated printing element is contacted with a material that will absorb or otherwise remove the softened or melted uncured photopolymer. This removal process is generally referred to as "blotting". Blotting is typically accomplished using a screen mesh or an absorbent fabric. Either woven or non-woven fabric is used and the fabric can be polymer based or paper, so long as the fabric can withstand the operating temperatures involved. In most instances, blotting is accomplished using rollers to bring the material and the heated printing plate element into contact.

U.S. Pat. No. 5,175,072 to Martens, the subject matter of which is herein incorporated by reference in its entirety, describes the removal of uncured portions of the photopolymer by using an absorbent sheet material. The uncured photopolymer layer is heated by conduction, convection, or other heating method to a temperature sufficient to effect melting. By maintaining more or less intimate contact of the absorbent sheet material with the photocurable layer, a transfer of the uncured photopolymer from the photopolymer layer to the absorbent sheet material takes place. While still in the heated condition, the absorbent sheet material is separated from the cured photopolymer layer in contact with the support layer to reveal the relief structure. After cooling, the resulting flexographic printing plate can be mounted on a printing plate cylinder.

Upon completion of the blotting process, the printing plate element is preferably post-exposed to further actinic radiation in the same machine, cooled and then ready for use.

Current thermal development apparatuses using heated rolls for blotting away the uncured photopolymer typically use only one heated roll that is of approximately the same width as the plate. This increases the difficulty in making printing elements of different sizes. In addition, additional problems may arise when attempting to make the blotting machine larger to accommodate larger printing elements.

Another problem with the current blotting methods is that a tremendous amount of force (approximately 100 pounds/linear inch) must be applied by the heated roll to force the blotting material into the image on the printing element. This large force can cause the heated roll to bend, resulting in an uneven floor. Furthermore, the heating and blotting process must often be repeated several times in order to obtain effective removal of the uncured photopolymer.

In addition, the biggest downfall to the commercialization of thermally produced plates is relief variation. Due to the fact that not all of the uncured resin may get processed, the amount of resin that actually gets removed can be affected by various conditions in the process. For instance, the type of image being processed can affect relief tolerance, such as combination copy, in which screens and solids are both present within the same image. Next, the actual set up conditions in the thermal processor, such as the number of cycles and the processing temperature, can affect uncured resin removal in a non-uniform manner. Resin removal, via a thermal process, is a very empirical-based output, and is ultimately dependent on the true need of the end-user. Thus, it is highly likely that the final process will result in residual un-cured resin remaining on the plate that will then become cured during the resultant post-exposure steps.

A further complication of thermally processing plates is that the traditional process of producing seamless photopolymer sleeves can inherently produce floor variations. While flat plates that are processed thermally may have floor inconsistencies that are manifested from the thermal process itself, the true floor of such plates is actually very uniform. This uniformity can be confirmed by simply processing the plate in a solvent-based developing system. However, for printing sleeves, the light exposure techniques that exist today are limited by the ability to expose the sleeve through the back side of the sleeve carrier, which ultimately results in an inherent floor variation. This inherent variation can be further complicated by the thermal process itself, which defines the need for an improved method of eliminating this pitfall in the sleeve manufacturing process.

To that end, the present invention is directed to an improved method of manufacturing photosensitive printing elements that minimizes relief variation and improves image fidelity. By providing a fully cured layer underneath the image layer, a sleeve can be properly processed without concern over floor variation or loss in image fidelity.

Furthermore, exposing, developing and post exposure/detack steps have traditionally been carried out in separate devices. This requires additional time to transfer the printing element from the exposure device to the development device and can affect the quality of the finished plate as a result of handling the printing element. Thus, it would be desirable to accomplish the exposing, developing and post exposure/detack steps in the same apparatus in order to improve both the quality and the accuracy of the final product.

SUMMARY OF THE INVENTION

It is an object of the present invention to minimize relief variation in the floor layer of photosensitive printing sleeves.

It is another object of the present invention to improve image fidelity on the printing surface.

To that end, the present invention is directed to an improved method of manufacturing photosensitive printing elements that minimizes relief variation and improves image fidelity and to an improved cylindrical photosensitive printing element made by the process of the invention that can be thermally developed.

In a preferred embodiment, the improved method of the invention comprises:

a) providing a photosensitive printing element on a rotatable cylindrical support, the photosensitive printing element comprising:
   i) a support layer;
   ii) a first layer of photocurable material on the support layer, the first layer of photocurable material being pre-cured;
   iii) at least a second layer of photocurable material deposited on the first layer of photocurable material; and
   iv) a masking layer on top of the at least second layer of photocurable material that allows for the selective polymerization of the at least second layer of photocurable material;

b) imaging the at least second layer of photocurable material by ablating the masking layer to create a pattern of a desired image on the surface of the at least second layer of photocurable material;

c) exposing the second layer of photocurable material through the masking layer to one or more sources of actinic radiation to crosslink and cure portions of the second layer of photocurable material that are not covered by the masking layer;

d) melting or softening non-crosslinked polymer on the imaged and exposed surface of the photosensitive printing element;

e) causing contact between the imaged and exposed surface of the photosensitive printing element and at least one roll; and f) rotating the at least one roll against at least a portion of the imaged and exposed surface of the photosensitive printing element to remove non-crosslinked photopolymer that has been melted or softened from the imaged and exposed surface of the photosensitive printing element.

DETAILED DESCRIPTION OF THE PREFERRED EMBODIMENTS OF THE INVENTION

The present invention is directed to an improved method of thermally processing photosensitive printing sleeves that minimizes relief variation and improves image fidelity. The method of the invention pre-cures the floor layer of the photosensitive printing sleeve prior to removing non-crosslinked polymer from an imaged surface of the photosensitive printing element with at least one roll.

By pre-curing the first layer using traditional flood exposure techniques, the floor layer on the resultant printing element is more uniform from side to side. As a result, the image fidelity of the printing element is more pure, with fewer inconsistencies in the image areas across the sleeve. Furthermore, by pre-curing the first layer, the resultant floor layer is generally more tack free, reducing the tendency to build up ink, lint, and debris during the printing and storage process. The pre-cured floor also provides a distinct aesthetic advantage in the finished printing element, providing a smooth texture across the surface of the floor, as opposed to the rough surface often associated with thermally processed printing elements. Such an appearance can lend itself to better clarity during sleeve inspection, improving the customer's ability to quality control their processes. Finally, a pre-cured floor provides the end user with a true limit to their processing capability, in other words, there is no uncured material remaining after processing is complete. This is important because uncured material that is left unprocessed could lend itself to increased tack in the floor of the printing element, or degraded image fidelity due to the above mentioned light uniformity issues.

In a preferred embodiment, immediately prior to removal of the non-crosslinked polymer in a thermal developing step, the photosensitive printing element is selectively exposed to actinic radiation to selectively crosslink and cure selected (i.e., imaged) portions of the photosensitive printing element.

The method generally comprises the steps of:

a) providing a photosensitive printing element on a rotatable cylindrical support, the photosensitive printing element comprising:
  i) a support layer;
  ii) a first layer of photocurable material on the support layer, the first layer of photocurable material being pre-cured;
  iii) at least a second layer of photocurable material deposited on the first layer of photocurable material; and
  iv) a masking layer on top of the at least second layer of photocurable material that allows for the selective polymerization of the at least second layer of photocurable material;

b) imaging the at least second layer of photocurable material by ablating the masking layer to create a pattern of a desired image on the surface of the at least second layer of photocurable material;

c) exposing the second layer of photocurable material through the masking layer to one or more sources of actinic radiation to crosslink and cure portions of the second layer of photocurable material that are not covered by the masking layer;

d) melting or softening non-crosslinked polymer on the imaged and exposed surface of the photosensitive printing element;

e) causing contact between the imaged and exposed surface of the photosensitive printing element and at least one roll; and f) rotating the at least one roll against at least a portion of the imaged and exposed surface of the photosensitive printing element to remove non-crosslinked photopolymer that has been melted or softened from the imaged and exposed surface of the photosensitive printing element.

The at least one roll can traverse the length of the cylindrical photosensitive printing element in a spiral or stepwise manner. In a preferred embodiment, the at least one roll traverses the length of the photosensitive printing element one or multiple times until all of the non-crosslinked polymer is removed from the imaged surface of the photosensitive printing element. The roll can also be angled such that its axis of rotation is not parallel with the axis of rotation of the photosensitive printing element, and can be transverse to the axis of rotation of the photosensitive printing element.

In one embodiment of the invention, non-crosslinked photopolymer on the imaged and exposed surface of the photosensitive printing element is melted or softened by heating the at least one roll that contacts the imaged and exposed surface of the photosensitive printing element.

In another embodiment of the invention, non-crosslinked photopolymer on the imaged and exposed surface of the photosensitive printing element is melted or softened by positioning a heater adjacent to the imaged and exposed surface of the photosensitive printing element to soften or melt the non-crosslinked photopolymer for subsequent removal by the at least one roll. The heated roll and infrared heater may also be used together to facilitate additional removal of non-crosslinked photopolymer. If used, the at least one heated roll is typically maintained at a temperature that is between the melt temperature of the uncured photopolymer on the low end and the melt temperature of the cured photopolymer on the upper end. This will allow selective removal of the photopolymer thereby creating the image. Preferably the at least one heated roll is maintained at a temperature of about 350° F. to about 450° F.

As discussed above, in the preferred embodiment, the one or more sources of actinic radiation are one or more UV lights. If desired, the light source may include a filter to prevent undue heating of the printing element.

In another embodiment, the present invention relates to an improved combined exposing and developing apparatus and a method of using the apparatus to expose the photosensitive relief image printing plate to actinic radiation to selectively cure, i.e. crosslink, portions of the photopolymer layer revealed during the imaging step, and thermally developing the photosensitive printing plate to remove non-crosslinked polymer from the imaged and exposed surface of the photosensitive printing element during a process for manufacturing the photosensitive relief image printing element.

A photosensitive printing element is typically produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas.

Figure 1:
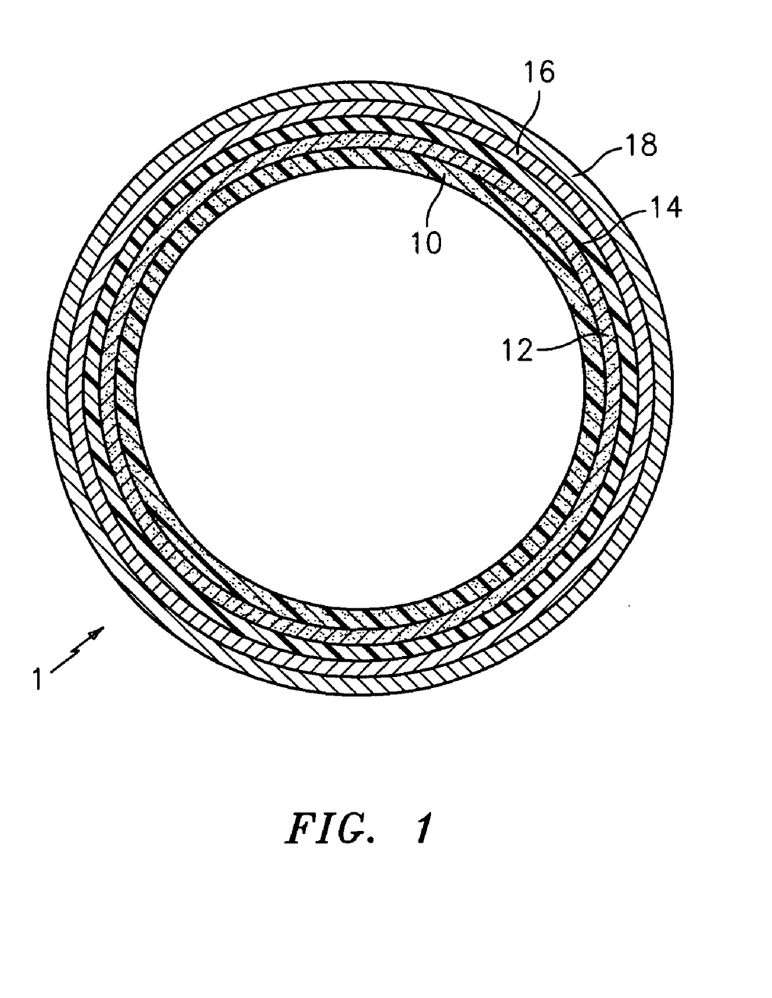
FIG. 1 depicts a typical cylindrical printing element manufactured by the process of the present invention.

A hollow cylindrical printing sleeve 1 with an integral imageable printing surface comprising the following elements:

(1) a hollow cylindrical support layer 10 made of a high strength polymer resin, which is optionally fiber reinforced;
(2) optionally, a layer of compressible material 12;
(3) a first photocurable layer 14 (floor layer) comprising a photopolymerizable resilient material;
(4) one or more second photocurable layers 16 (imageable layer); and
(5) a masking layer 18, which absorbs radiation at the wavelengths, used to polymerize the photocurable material but is selectively removable by laser ablation or other equivalent means.

The hollow cylindrical support layer 10 can be fabricated using conventional materials and methods applicable to producing printing sleeves. Preferably, the support layer 10 is fabricated from a polymer resin reinforced with a fibrous material such that the support layer 10 has a seamless surface. The fibrous material may contain fibers of glass, carbon, metal, ceramic, aramid or any other synthetic long fibers that increase the stability, stiffness, and rigidity of the support layer 10, and the fibrous material content of the support layer 10 is preferably from about 20 to about 70 percent by weight.

Preferred resins useful in fabricating the support layer 10 include polyester resins, phenolic resins and epoxy resins, but epoxy resins are most preferred. Preferably the support layer 10 is substantially uniformly transparent or translucent such that actinic radiation can be transmitted through the inner surface of the support layer 10 to the second layer of photocurable material layer 16. If the support layer 10 is substantially uniformly transparent or translucent, then preferably no separate compressible layer 12 is used and the first layer of photocurable material 14 can be the same as the second layer of photocurable material 16, with the first layer of photocurable material 14 being formed by back exposure through the support layer 10. One method of creating a uniformly transparent or translucent support layer 10 is by using a relatively clear resin with no fibrous material.

One method of fabricating the support layer 10 is to serially or repeatedly coat layers of the chosen resin(s) and fibrous material(s) around a rotating mandrel, which is the desired diameter of the interior of the hollow cylinder. Successive layers of resin and fibrous material are applied until the wall thickness of the base 10 is slightly in excess of the desired wall thickness. At this point, the resin is cured using heat, actinic radiation, and/or radiant energy. The support layer 10 is then separated from the mandrel. The outer diameter of the support layer 10 is then sanded, ground or otherwise machined to size. An alternate method of manufacture would consist of directly extruding the resin and fibrous material to form the required hollow cylinder. The cylinder is then cured and finished to specification.

Preferably, the support layer 10 is flexible and resilient enough so that it can be easily mounted and dismounted from the printing cylinder. However, when the air pressure is released, the inside diameter of the support layer 10 must retract to its original specified internal diameter such that it fits snuggly onto the printing cylinder. Air pressure for this operation is delivered through small holes in printing cylinder surface such that when applied, air fills the space between the outer surface of the printing cylinder and the inner surface of the support layer 10, thereby temporarily expanding the inside diameter of the support layer 10 allowing the support layer 10 to be easily mounted or dismounted from the printing cylinder. The support layer 10 usually ranges from about 10 mils to 100 mils in thickness.

Once the support layer 10 is fabricated, a layer of compressible material 12 is optionally applied to the outer surface of the support layer 10. The compressible layer can take a number of forms. The compressible material 12 may consist of a layer of solid foam material, which is adhesively bonded to the outer surface of the support layer 10, which may create an undesirable seam where the ends of the solid foam meet. Alternatively, and preferably, the layer of compressible material 12 is formed by uniformly mixing hollow microspheres with an uncured photocurable or thermally-curable resin formulation. The resin/microsphere mixture is then applied to the support layer 10 in a layer or layers using a knife or extrusion to provide uniform thickness. The resin/microsphere layer is then cured using heat, actinic radiation, and/or radiant energy as appropriate. Preferably, electron beam curing is advantageously used for curing the microsphere compressible foam layer. In a third alternative, a soft resilient polymer such as a polyurethane, or softer version of the styrene-isoprene-styrene or styrene-butadiene-styrene photocurable layer is used as the compressible material. In this instance, the uncured material is similarly applied using a knife or extrusion to ensure uniform thickness and then cured in place. After application and photocuring, the compressible layer is preferably further grounded or sanded to achieve a seamless surface. Either of the second or third alternatives creates the preferred seamless layer.

The thickness of the layer of compressible material can vary depending upon the material being used and the particular printing application. Generally, if a layer of compressible material is used, the thickness of the layer may range from about 20 mils to 40 mils. This thickness of the compressible layer assures wide latitude of approximately 20 mils impression during the printing without significant dot gain. The cured layer of compressible material can be sanded, ground, or otherwise machined to specification and to achieve a seamless surface.

Next, whether the layer of compressible material is used or not, a substantially continuous layer of a first photocurable material (floor layer) is applied on the outer surface of the support layer 10 or if used, on the outer surface of the layer of compressible material. It is entirely possible that the compressible layer 12 and the first layer of photocurable material 14 are one and the same. If the first layer of photocurable material floor and compressible layer are the same, microspheres can be included in the polymer/photopolymer composition to increase its compressibility. Preferably, the first layer of photocurable material 14 comprises a photopolymer, which is subsequently cured before the second layer of photocurable material 16 is applied. The photocuring of the first layer of photocurable material 14 is achieved by face exposure to actinic radiation for a certain length of time through the front. Once again, the first layer of photocurable material 14 after curing is preferably sanded, ground, or otherwise machined to specification and to achieve a seamless surface. The purpose of the first layer of photocurable material 14 is to ensure that the second layer of photocurable material (imageable layer) 16 has excellent adhesion and remains firmly attached to the hollow cylindrical base structure, even when very fine isolated structures are developed in the second layer of photocurable material 16. The first layer of photocurable material 14 also gives physical support to fine dots and lines during the printing process. This is especially critical for constructions where the first layer of photocurable material 14 and the second layer(s) of photocurable material 16 are relatively thin (~28–30 mil total). The first layer of photocurable material as used herein (face exposure from the front) also assures extreme uniformity of the relief layer, which is necessary for high-end printing applications where floor variation will create degradation of image fidelity. Also, since the first layer of photocurable material can be completely cured from the front, it assures a very dry surface after the processing step and post-exposure/detack steps. It is preferable for the first layer of photocurable material 14 to comprise the same photopolymer as is present in the second layer(s) of photocurable material 16. In any case, it is important for the first (floor) layer of photocurable material 14 to exhibit good adhesion to the layer below and to the second layer(s) of photocurable material.

As discussed above, it can be very challenging to hold the precise gage of the floor, which can result in a non-uniform floor across the sleeve, causing degradation of printing integrity. Moreover, in the case of the thicker sleeves, the amount of actinic light getting through can be extremely small because the sleeves are opaque.

To overcome this problem, exposure of the first (floor) layer of photocurable material 14 through the face and subsequent grinding, sanding, etc. to achieve the specification is found to be advantageous. Moreover, using this step achieved high adhesion to the sleeve surface without the use of primers/adhesives normally used in the art.

The first layer of photocurable material 14 is preferably applied as a liquid extrudate polymer, using a knife or extrusion to ensure uniform thickness. Once applied, the layer is cured from the front using heat, actinic radiation and/or radiant energy to form a substantially continuous seamless layer over the outer surface of the support layer 10 or the layer of compressible material 12 if used. If necessary, the first layer of photocurable material 14 can then be sanded, ground or otherwise machined to the proper outside diameter. The thickness of the floor layer may range from about 5 mils to about 134 mils. When cured the first layer of photocurable material 14, depending on the thickness and type of photopolymer typically has a resilience of from 40% to 70% and a hardness of from 30 to 70 Shore A as measured by ASTM D2240.

The second layer of photocurable material 16 is formed from a material which can be imaged, either mechanically, optically, via heat or differential melting and/or chemically. Preferably, the second (imageable) layer of photocurable material 16 comprises a photocurable or photopolymerizable material. Again, in order to make a seamless layer, the photocurable material is applied to the first layer of photocurable material 14 by spreading, dipping, casting, extruding or molding. The thickness is controlled either by using a knife, die or mold as appropriate. If necessary, the precise thickness of the second layer(s) of photocurable material 16 can be adjusted via grinding, sanding or other machining. The thickness of the second layer(s) of photocurable material usually ranges from about 15 mil to about 35 mil depending on the printing application. If desired, more than one layer can be sequentially applied.

The photocurable material for use in fabricating the first layer of photocurable material 14 and the second layer of photocurable material 16 generally comprises binder(s), monomer(s) and photoinitiator(s). In addition, the photocurable composition may also comprise other additives known in the art such as plasticizers, anti-oxidants, oxygen scavengers, flow modifiers, colorants and fillers.

The binder preferably comprises an A-B-A type block copolymer where A represents a non-elastomeric block, preferably a vinyl polymer or most preferably polystyrene, and B represents an elastomeric block, preferably polybutadiene or polyisoprene. Preferably, the non-elastomer to elastomer ratio is in the range of from 10:90 to 35:65.

The at least one monomer is typically an ethylenically unsaturated compound. Suitable monomers include multifunctional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, and 1,4-butanediol diacrylate.

The photocurable material also includes at least one photoinitiator. Any of the known classes of photoinitiators, particularly free radical photoinitiators such as quinones, bemzophenones, benzoin ethers, aryl ketones, peroxides, biimidazoles, diacyliodoniums, triacylsulfoniums, phosphoniums, and diazoniums.

Additional examples of suitable photocurable materials useful in fabricating the first layer of photocurable material 14 and the second layer of photocurable material 16 can be found in U.S. Pat. No. 4,045,231 to Toda et al., U.S. Pat. No. 4,323,636 to Chen, U.S. Pat. No. 5,223,375 to Berrier et al., and U.S. Pat. No. 5,290,633 to Devlin et al., the teachings each of which are incorporated herein by reference in their entirety.

On top of the second layer of photocurable material 16 is optionally, but preferably, a masking layer 18, which allows for the selective polymerization of the second layer of photocurable material 16. Thus, the masking layer 18 must be made to be removed or become transparent to actinic radiation in areas where the second layer of photocurable material 16 is to be polymerized, but at the same time block actinic radiation in areas where the second layer of photocurable material 16 is to remain unpolymerized and developed away to create the relief image necessary for flexographic printing.

Preferably, the masking layer is selectively ablatable using laser radiation in the pattern of the desired image. In the case of laser ablation, the masking layer generally comprises an ultraviolet radiation absorbing material, an infrared radiation absorbing material and a binder. Dark inorganic pigments such as carbon black or graphite can function as both the ultraviolet radiation absorbing material and infrared radiation absorbing material. Suitable binders include polyamides and cellulosic polymers. Suitable masking layers are described in U.S. Pat. No. 6,605,410 to Yang and U.S. Pat. Nos. 6,238,837 an 5,262,275, both to Fan, the teachings each of which are incorporated herein by reference in their entirety.

The masking layer 18 can be disposed on the second layer of photocurable material 16 using several methods. It can be spread directly on the second layer of photocurable material 16 and dried. It can be separately spread on a plastic cover sheet and the coversheet laminated to the second layer of photocurable material 16 with the masking layer 18 between the second layer of photocurable material 16 and the coversheet. In this case, the coversheet is stripped away before use. The masking layer must be removable using the development means used to develop away (remove) the uncured portions of the second layer of photocurable material 16.

The masking layer usually ranges from about 1 μm to about 10 μm and has an optical density of from 2.5 to 4.5.

The printing sleeve 1 can be utilized in the following manner:

1. The masking layer 18 is selectively exposed to laser radiation at a wavelength and power such that the portions of masking layer 18 contacted with the laser radiation are ablated away without damaging the underlying second layer of photocurable material 16. Preferably the laser is computer controlled to scan the surface of the masking layer 18 according to the image desired. In this regard, please refer to U.S. Pat. No. 5,760,880 to Fan et al., the disclosure of which is incorporated herein by reference in its entirety.
2. The surface of the printing sleeve 1 is then exposed to actinic radiation such that the portions of the second layer of photocurable material 16 that have been exposed as a result of the ablation of portions of the masking layer 18 above are polymerized, but the portions of the second layer of photocurable material 16 that remain covered by masking layer 18 remain unpolymerized.
3. The printing sleeve 1 is subjected to development using heat such that the masking layer 18 and the unpolymerized portions of the second layer of photocurable material 16 are removed leaving behind the polymerized portions of the second layer of photocurable material 16 standing out in relief in the image desired.
4. The printing sleeve 1 may then be subjected to optionally post-curing and detacking of the remaining second layer of photocurable material 16 using actinic radiation or heat.
5. Finally, the printing sleeve 1 is fitted onto a printing cylinder using high pressure air to temporarily expand the inside diameter of the printing sleeve 1. The high pressure air is then removed so that the printing sleeve 1 contracts to fit onto the printing cylinder.
6. Optionally, the above printing sleeve 1 may be fitted onto a bridge cylinder using high pressure air to temporarily expand the inside diameter of the printing sleeve 1, which is then removed so that the printing sleeve 1 contracts to fit onto the bridge cylinder. The bridge cylinder then acts as the printing construction. A suitable example of a bridge cylinder is Eliminator™, available from MacDermid Printing Solutions.
7. The printing cylinder with the printing sleeve 1 mounted thereon is then installed in a flexographic printing press to begin printing.

Cylindrical printing sleeves 1 of the invention are optimally developed using heat. In a preferred embodiment, the thermal developing system may also include an exposure device so that the printing sleeve 1 may be exposed and developed in the same system without the need to remove the printing sleeve 1 from the exposing device to place it into the thermal developing system. The thermal developing system may further comprise a means for post exposure/detack in the same system.

The thermal developing system generally comprises:

(i) means to support, and preferably cycle or rotate, a photosensitive printing element (printing sleeve);

(ii) optionally, but preferably, means for exposing a surface of the photosensitive printing element to actinic radiation; and (iii) means for thermally developing the photosensitive printing element, wherein the thermally developing means typically comprises:

a) means for softening or melting non-crosslinked photopolymer on the surface of the photosensitive printing element;

b) at least one roll that is contactable with the surface of the photosensitive printing element and capable of moving over at least a portion of the surface of the photosensitive printing element to remove the softened or melted non-crosslinked photopolymer on the surface of the photosensitive printing element; and c) means for maintaining contact between the at least one roll and the surface of the photosensitive printing element.

Figure 2:
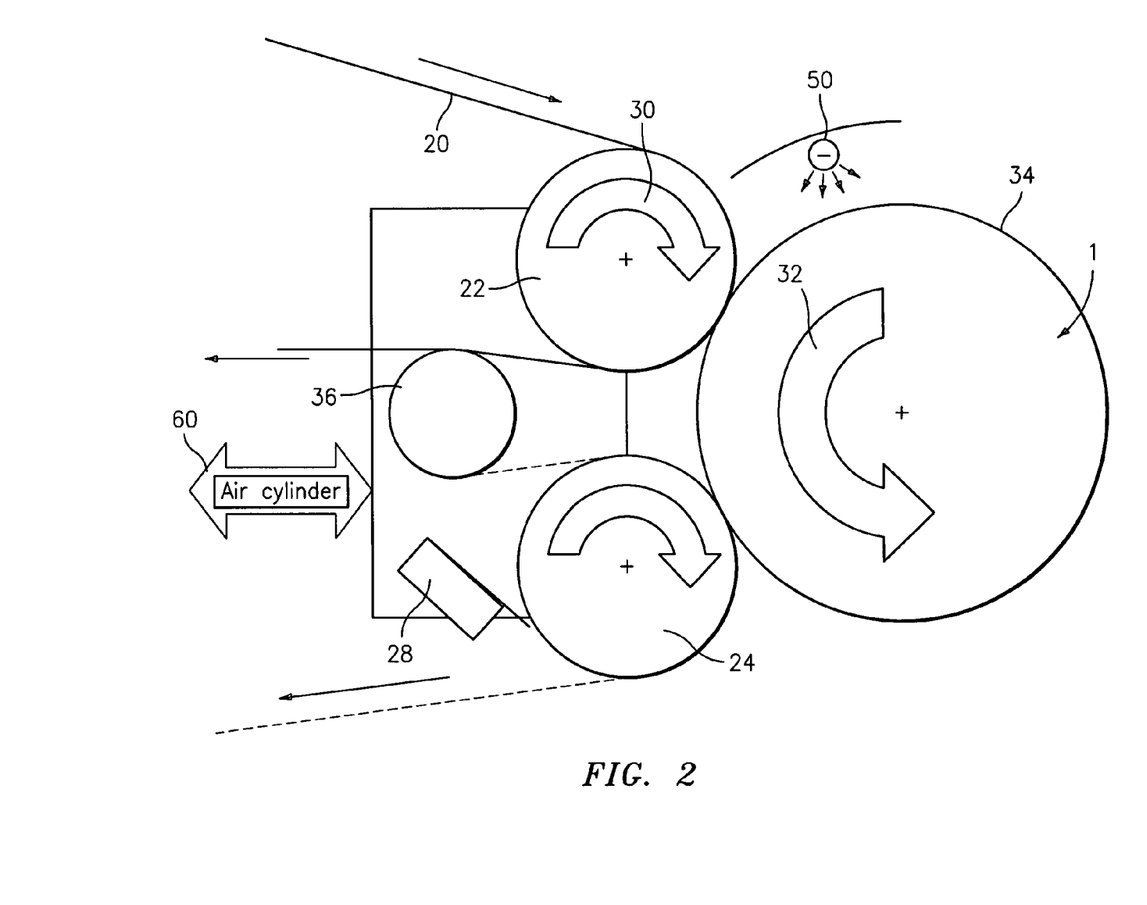
FIG. 2 depicts one embodiment of a thermal development apparatus that is usable in the process of the instant invention.

As depicted in FIG. 2, the thermal developing system 1 generally comprises at least one roll 22 that is contactable with an imaged surface 34 of a photosensitive printing element 1 and a means 60 for maintaining contact between the at least one roll 22 and the imaged surface 34 of the photosensitive printing element 1. In one embodiment, the at least one roll 22 is heated and is moved over at least a portion of the imaged surface 34 of the photosensitive printing element 1, and non-crosslinked polymer on the imaged surface 34 of the photosensitive printing element 1 is melted and removed by the at least one heatable roll 22. In another embodiment a heating source 50 is positioned prior to the roll 22 to soften or melt non-crosslinked polymer on the imaged and exposed surface of the photosensitive printing element for subsequent removal by the roll 22. The heating source 50 may also be used in conjunction with the heated roll 22 to at least partially soften or melt non-crosslinked polymer on the imaged surface of the photosensitive printing element 1.

The at least one roll 22 generally has a length of about 4 to about 12 inches, and a diameter of about 4 to about 6 inches, although the invention is not limited to rolls of a particular size or diameter. A skilled artisan would be able to determine a suitable length and diameter for a roll that would be usable in the thermal developing system.

The thermal developing system may optionally comprise two rolls 22 and 24 that are opposably positionable adjacent and apart from each other and are each maintainable in contact with the imaged surface 34 of the photosensitive printing element 1. When the two rolls 22 and 24 are contacted with the imaged surface 34 of the photosensitive printing element 1, the two rolls 22 and 24 are self-centering against the imaged surface 34 of the photosensitive printing element 1.

The heating source 50 is typically an infrared heater or hot air heater, although other heating sources could also be used in the practice of the invention and would be known to those skilled in the art. In a preferred embodiment, the heating source is an infrared heater. In the alternative, or in addition, the at least one roll can be a heated roller with a heating source contained within the roll.

The means 60 for maintaining contact between the at least one roll 22 and the imaged surface 34 of the photosensitive printing element 1 typically comprises an air cylinder or a hydraulic cylinder that acts to force the at least one roll 22 against the imaged surface 34 of the photosensitive printing element 1. Other means for maintaining the contact between the at least one roll 22 and the photosensitive printing element 1 would also be known to one skilled in the art.

The thermal developing system preferably comprises a blotting material 20 positioned on at least a portion of the at least one roll 22. Thus, when the at least one roll 22 is heated and is contacted with the imaged surface 34 of the photosensitive printing element 1, non-crosslinked polymer on the imaged surface 34 of the photosensitive printing element 1 is melted by the heated roll 22 and is removed by the blotting material 20. Alternately, the heating source 50 melts or softens the non-crosslinked polymer and the blotting material 20 positioned on at least a portion of the at least one roll removes the melted or softened polymer.

Blotting materials that are usable include screen mesh, paper, and absorbent fabrics, including polymer-based and non-polymer-based fabrics. The blotting material 20 is typically looped under and around at least the portion of the at least one roll 22 that contacts the imaged surface 34 of the photosensitive printing element 1. The blotting material 20 is continuously supplied to the at least one roll 22 from a remote source (not shown) of the blotting material 20. The thermal developing system further comprises a rewind device (not shown) to carry away the blotting material 20 that contains the removed non-crosslinked polymer.

Alternately, the thermal developing system may comprise a doctor blade 28 that is positionable adjacent to the at least one roll 22 or 24, which is shown positioned adjacent to the second roll 24 and can be used in place of the blotting roll. When the at least one roll 24 removes non-crosslinked polymer from the imaged surface 34 of the photosensitive printing element 1, the doctor blade 28 wipes the non-crosslinked polymer from the surface of the at least one roll 24.

The thermal developing system removes non-crosslinked polymer from the imaged surface 34 of the photosensitive printing element by rotating the at least one roll 22 over at least a portion of the imaged surface 34 of the photosensitive printing element 1. Preferably, the at least one roll 22 rotates in a first direction 30 and the cylindrical photosensitive printing element 1 rotates in an opposite direction 32 from the at least one roll 22.

Figure 4:
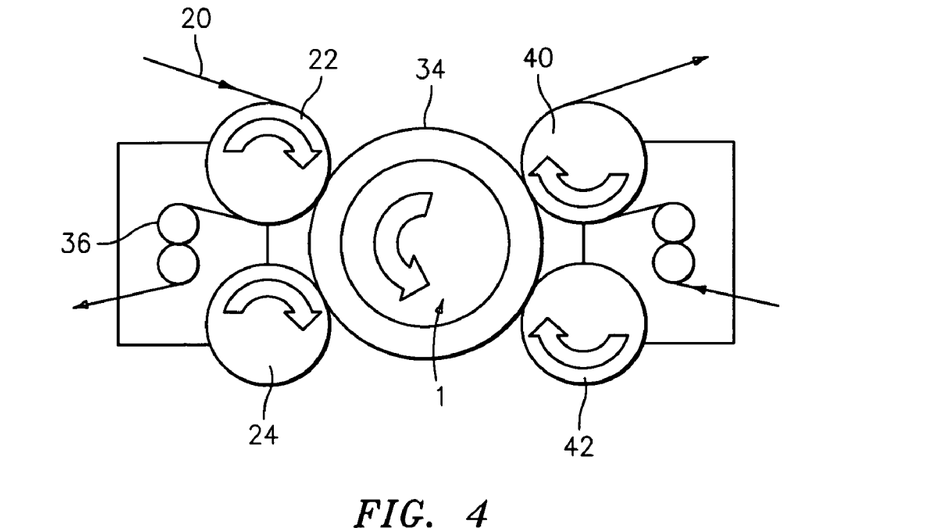
FIG. 4 depicts another embodiment of a thermal development apparatus that is usable in the process of the instant invention wherein opposing heads are used to improve imaging speed and eliminate roll bending and machine stiffness design problems.

The thermal developing system also comprises means 26 (shown in FIG. 4) for allowing the at least one roll to traverse along the length of the cylindrical photosensitive printing element, and such means typically comprise one or more carriages. The advantage to this design feature is that movement of the roll across the surface of the printing element allows the thermal developing system to accommodate printing elements of various lengths and diameters. In this case, the at least one roll rotates along the length or around the circumference of the printing element and also moves in a direction parallel to the axis of rotation along the width of the printing element.

The blotting material 20 may be continuously fed to the two rolls 22 and 24 by looping the blotting material 20 under and around at least the portion of the first roll 22 that is contactable with the imaged surface 34 of the photosensitive printing element 1, looping the blotting material 20 around one or more track rolls 36 positioned between the two rolls 22 and 24, and then looping the blotting material 20 under and around at least the portion of the second roll 24 that is contactable with the imaged surface 34 of the photosensitive printing element 1.

Figure 3:
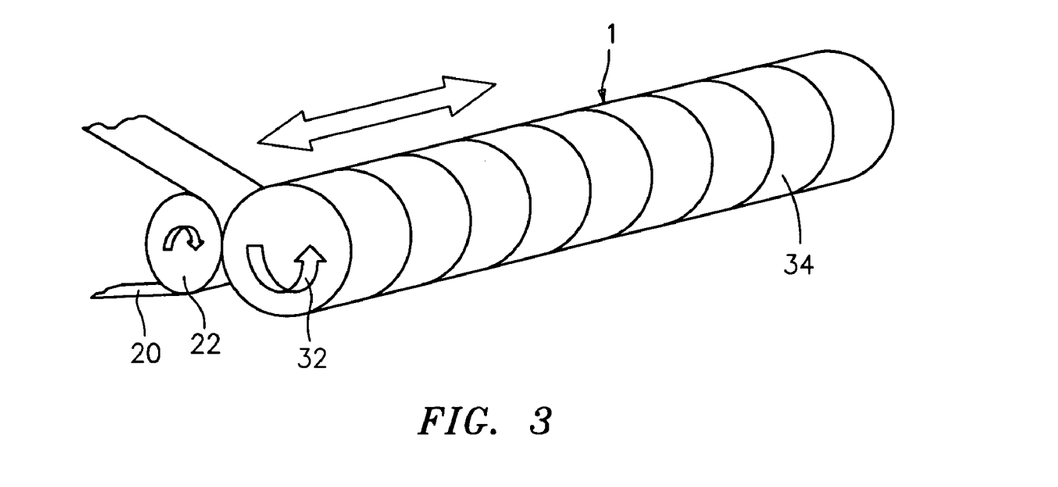
FIG. 3 depicts a different view of the thermal development apparatus that is usable in the process of the instant invention and shows the motion of the heated roll traversing the length of the cylindrical printing element.

As shown in FIG. 3, the thermal developing system may further comprise one or more additional rolls 40 and 42 that are positionable in an opposing position on an opposite side of the cylindrical photosensitive printing element 1. The one or more additional rolls 40 and 42 are maintainable in contact with at least a portion of the imaged surface 34 of the photosensitive printing element 1. When the one or more additional rolls 40 and 42 are contacted with the imaged surface 34 of the photosensitive printing element 1, removal of resin from the imaged surface 34 of the photosensitive printing element 1 as well as the imaging speed can be increased. Use of the two additional rolls 40 and 42 may also eliminate roll bending and machine stiffness design problems, which can cause uneven floors. Also, since the high forces required to push the blotter into the resin oppose each other, the improved design features of the invention allow for the use of much lighter materials (i.e., fiberglass instead of steel support shafts) to support the printing sleeve while it is being processed.

Figure 5:
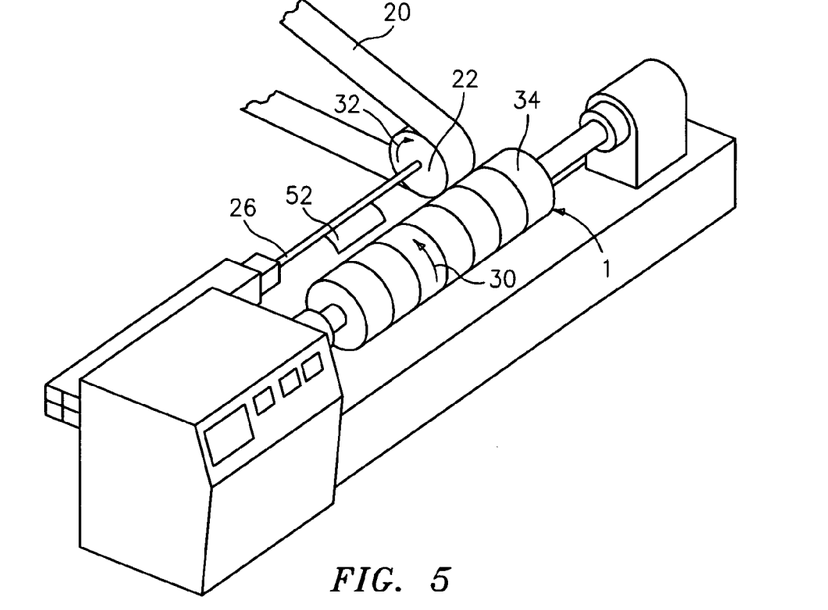
FIG. 5 depicts an embodiment that is usable in the process of the instant invention, wherein the exposing and developing steps are accomplished at the same time on the same apparatus.

As shown in FIG. 5, the thermal developing system may include means for both exposing and thermally developing the photosensitive printing element.

The exposing and thermal development system depicted in FIG. 5 typically comprises one or more sources of actinic radiation 52 mounted on a carriage 26 that can traverse the length of the photosensitive printing element 1. The one or more sources of actinic radiation 52 typically comprise one or more UV light sources that are capable of selectively exposing and curing the imaged surface 34 of the photosensitive printing element 1.

During operation, the carriage 26 traverses the one or more sources of actinic radiation 52 over the length of the imaged surface 34 of the flexographic printing element 1 to cure the flexographic printing element 1. While the carriage 26 traverses the length of the imaged surface 34 of the photosensitive printing element 1, the photosensitive printing element 1 is continuously rotated in a first direction 30 so that the entire surface of the photosensitive printing element 1 is exposed to cure the image on the surface 34 of the photosensitive printing element 1.

The at least one roll 22 may be mounted on the same carriage 26 as the one or more sources of actinic radiation 52, or may be mounted on a separate carriage (not shown) from the one or more sources of actinic radiation 52. As shown in FIG. 2, the system also contains means 60 for maintaining contact between the at least one roll 22 and the imaged surface 34 of the photosensitive printing element 1.

The at least one roll 22 is moved over at least a portion of the imaged surface 34 of the photosensitive printing element 1 that has previously been traversed by the one or more sources of actinic radiation 52 to remove non-crosslinked polymer on the imaged surface 34 of the photosensitive printing element 1.

In a preferred embodiment, the photosensitive printing element 1 is rotated in the first direction 30, while the roll 22 is rotated in a second direction 32. The photosensitive printing element 1 is continuously rotated in the first direction 30 during both the exposing and developing steps so that the entire imaged surface 34 of the photosensitive printing element 1 can be exposed and developed. The spiral nature of this process, wherein the printing sleeve rotates as the carriage 26 traverses the length of the flexographic printing element 1 ensures even exposure and development across any size printing element 1.

Figure 6:
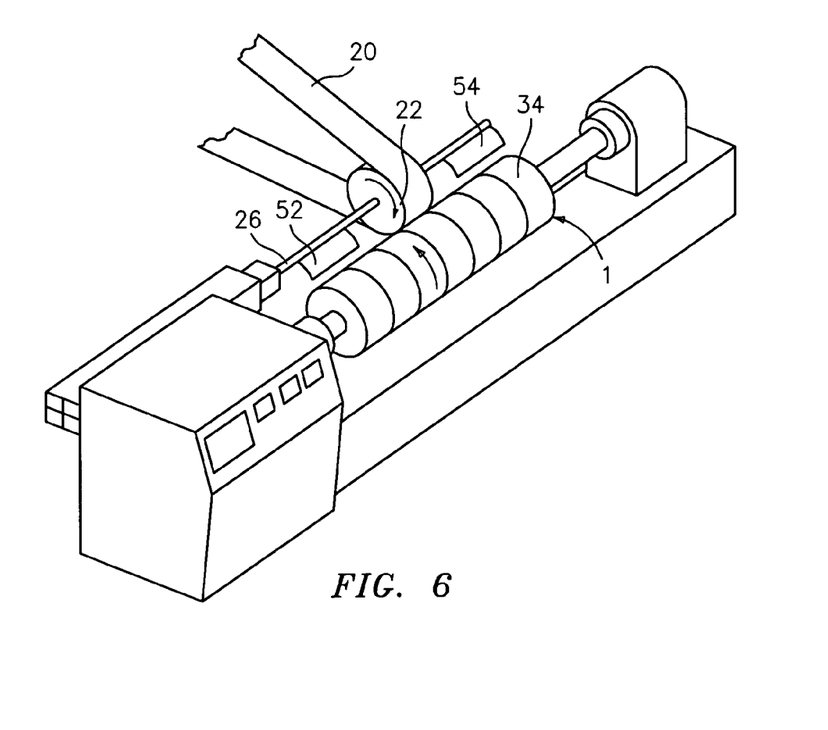
FIG. 6 depicts another embodiment that is usable in the process of the instant invention, wherein the combined exposing and developing apparatus further comprises a device to de-tack and post cure the printing element.

In another embodiment, as depicted in FIG. 6, the thermal development system may further comprises a device 54 for detacking and post-curing the photosensitive printing element 1 once the photosensitive printing element 1 has been exposed with the one or more UV lights 52 and thermally developed with the at least one roll 22. The use of the detacking and post-curing device 54 in the system eliminates the need for handling the printing element, i.e., moving the printing element to a subsequent apparatus, and again provides for a more precise and accurate printing element.

What is claimed is:

1. A method of manufacturing a photosensitive printing element comprising the steps of:

a) providing a photosensitive printing element on a rotatable cylindrical support, the photosensitive printing element comprising:
  i) a support layer;
  ii) a first layer of photocurable material on the support layer, the first layer of photocurable material being pre-cured;
  iii) at least a second layer of photocurable material deposited on the first layer of pre-cured photocurable material; and
  iv) a masking layer on top of the at least second layer of photocurable material that allows for the selective polymerization of the at least second layer of photocurable material;
b) imaging the at least second layer of photocurable material by ablating the masking layer to create a pattern of a desired image on the surface of the at least second layer of photocurable material;
c) exposing the second layer of photocurable material through the masking layer to one or more sources of actinic radiation to crosslink and cure portions of the second layer of photocurable material that are not covered by the masking layer;
d) melting or softening uncured portions of the second layer of photocurable material on the imaged and exposed surface of the photosensitive printing element;
e) causing contact between the imaged and exposed surface of the photosensitive printing element and at least one roll; and
f) rotating the at least one roll against at least a portion of the imaged and exposed surface of the photosensitive printing element to remove non-crosslinked photopolymer that has been melted or softened from the imaged and exposed surface of the photosensitive printing element.

2. The method according to claim 1, wherein the first layer of photocurable material is pre-cured from the front of the photosensitive printing element.

3. The method according to claim 2, further comprising the step of grinding, sanding, or machining the first layer of photocurable material to achieve a desired thickness before the at least second layer of photocurable material is deposited on the first layer of photocurable material.

4. The method according to claim 1, wherein the masking layer is selectively exposed to a source of laser radiation at a selected wavelength and power to ablate portions of the masking layer that are contacted with the source of laser radiation without damage to the underlying second layer of photocurable material to create the desired image on a surface of the second layer of photocurable material.

5. The method according to claim 1, further comprising a step of detacking and post-curing the photosensitive printing element.

6. The method according to claim 1, wherein the one or more sources of actinic radiation comprise one or more ultraviolet lights.

7. The method according to claim 6, wherein the one or more sources of actinic radiation traverse the length of the photosensitive printing element.

8. The method according to claim 1, wherein the at least one roll traverses the length of the photosensitive printing element.

9. The method according to claim 8, wherein the at least one roll traverses the length of the photosensitive printing element multiple times.

10. The method according to claim 8, wherein the at least one roll traverses the length of the photosensitive printing element in a spiral or stepwise manner.

11. The method according to claim 1, wherein the at least one roll rotates in a first direction and the cylindrical photosensitive printing element rotates in an opposite direction from the at least one roll.

12. The method according to claim 1, wherein an air cylinder or a hydraulic cylinder is used to maintain contact between the at least one roll and the surface of the photosensitive printing element.

13. The method according to claim 1, wherein at least the portion of the at least one roll that is in contact with the surface of the photosensitive printing element is covered with a blotting material and the blotting material removes the non-crosslinked polymer from the surface of the photosensitive printing element.

14. The method according to claim 13, wherein the blotting material is looped under and around at the least the portion of the at least one roll that is in contact with the surface of the photosensitive printing element.

15. The method according to claim 13, wherein the blotting material is continuously fed to the at least one roll from a remote source of the blotting material.

16. The method according to claim 13, wherein the blotting material that contains the removed non-crosslinked photopolymer is rewound onto a rewind device.

17. The method according to claim 13, wherein the blotting material comprises paper.

18. The method according to claim 1, wherein the non-crosslinked polymer remaining on the at least one roll after removal from the imaged surface of the photosensitive printing element is removed from the at least one roll by positioning a doctor blade adjacent to the at least one roll to wipe the non-crosslinked polymer from the surface of the at least one roll.

19. The method according to claim 1, wherein the at least one roll comprises two rolls that are positioned adjacent and apart from each other and are each maintained in contact with the imaged surface of the photosensitive printing element and wherein the two rolls are self-centering against the imaged surface of the flexographic printing element.

20. The method according to claim 19, wherein the blotting material is continuously fed to the two rolls by wrapping blotting material around at least the portion of the first roll that is in contact wit the imaged surface of the photosensitive printing element, looping the blotting material around one or more track rolls positioned between the two rolls, and then wrapping the blotting material around at least the portion of the second roll that is in contact with the imaged surface of the flexographic printing element.

21. The method according to claim 19, wherein one or more additional rolls are positioned in an opposing position on an opposite side of the cylindrical photosensitive printing element and maintained in contact with at least a portion of the imaged surface of the flexographic printing element.

22. The method according to claim 1, wherein the non-crosslinked photopolymer on the imaged and exposed surface of the photosensitive printing element is melted or softened by heating the at least one roll that contacts the imaged and exposed surface of the flexographic printing element.

23. The method according to claim 22, further comprising a heater positioned adjacent to the imaged and exposed surface of the photosensitive printing element to provide additional melting or softening of the non-crosslinked photopolymer.

24. The method according to claim 22, wherein the at least one heated roll is maintained at a temperature of about 350° F. to about 450° F.

25. The method according to claim 1, wherein the non-crosslinked photopolymer on the imaged and exposed surface of the photosensitive printing element is melted or softened by positioning a heater adjacent to the imaged and exposed surface of the flexographic printing element.

* * * * *